(12) United States Patent
Kurimoto et al.

(10) Patent No.: US 11,777,469 B2
(45) Date of Patent: Oct. 3, 2023

(54) BONDED SUBSTRATE, SURFACE ACOUSTIC WAVE ELEMENT, SURFACE ACOUSTIC WAVE ELEMENT DEVICE, AND BONDED SUBSTRATE MANUFACTURING METHOD

(71) Applicant: THE JAPAN STEEL WORKS, LTD., Tokyo (JP)

(72) Inventors: Kouhei Kurimoto, Muroran (JP); Kazuhito Kishida, Tokyo (JP); Rinzo Kayano, Muroran (JP); Jun Mizuno, Tokyo (JP); Shoji Kakio, Kofu (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 794 days.

(21) Appl. No.: 16/622,859

(22) PCT Filed: Jun. 7, 2018

(86) PCT No.: PCT/JP2018/021898
§ 371 (c)(1),
(2) Date: Dec. 13, 2019

(87) PCT Pub. No.: WO2018/230442
PCT Pub. Date: Dec. 20, 2018

(65) Prior Publication Data
US 2020/0127634 A1 Apr. 23, 2020

(30) Foreign Application Priority Data
Jun. 14, 2017 (JP) .................................. 2017-117281

(51) Int. Cl.
*H03H 9/02* (2006.01)
*H03H 3/08* (2006.01)
(Continued)

(52) U.S. Cl.
CPC .......... *H03H 9/02574* (2013.01); *H03H 3/08* (2013.01); *H03H 9/02551* (2013.01);
(Continued)

(58) Field of Classification Search
CPC ........... H03H 9/02574; H03H 9/02551; H03H 9/02559; H03H 9/145; H03H 9/25
(Continued)

(56) References Cited

U.S. PATENT DOCUMENTS 3,914,836 A  10/1975 Hafner et al.
5,719,538 A * 2/1998 Kadota .............. H03H 9/02551
                                                310/313 A
(Continued)

FOREIGN PATENT DOCUMENTS

JP   H06326553 A   11/1994
JP   H07154177 A    6/1995
(Continued)

OTHER PUBLICATIONS

Japanese Office Action (and English language translation thereof) dated Feb. 12, 2020 issued in Japanese Application No. 2016-157122 which corresponds to related U.S. Appl. No. 16/413,356.
Related U.S. Appl. No. 16/969,912; First Named Inventor: Kouhei Kurimoto; Title: "Bonded Substrate, Surface Acoustic Wave Element, Surface Acoustic Wave Element Device, and Method for Manufacturing Bonded Substrate"; filed Aug. 13, 2020.
(Continued)

*Primary Examiner* — Derek J Rosenau
(74) *Attorney, Agent, or Firm* — Holtz, Holtz & Volek PC

(57) ABSTRACT

A bonded substrate includes a quartz substrate and a piezoelectric substrate which is bonded on the quartz substrate and on which a surface acoustic wave propagates, wherein the quartz substrate and the piezoelectric substrate are bonded by covalently coupling at a bonding interface, and an orientation of the quartz substrate and an orientation of the piezoelectric substrate intersect with each other on an orthogonal direction side or in the range of 65 degrees to 115 degrees in a bonding surface direction.

19 Claims, 14 Drawing Sheets

(51) Int. Cl.
  *H03H 9/145* (2006.01)
  *H03H 9/25* (2006.01)
(52) U.S. Cl.
  CPC ........ *H03H 9/02559* (2013.01); *H03H 9/145* (2013.01); *H03H 9/25* (2013.01)
(58) Field of Classification Search
  USPC ...... 310/313 R, 313 A, 313 B, 313 C, 313 D
  See application file for complete search history.

(56) References Cited

U.S. PATENT DOCUMENTS

| | | | |
|---|---|---|---|
| 7,208,859 B2 | 4/2007 | Miura et al. | |
| 7,609,129 B2 | 10/2009 | Yokota et al. | |
| 8,288,918 B2 | 10/2012 | Suzuki et al. | |
| 8,585,847 B2 | 11/2013 | Suzuki et al. | |
| 8,973,229 B2 | 3/2015 | Kando et al. | |
| 10,340,881 B2 | 7/2019 | Kurimoto et al. | |
| 2005/0194864 A1* | 9/2005 | Miura ................ | H03H 9/02574 310/313 R |
| 2008/0229831 A1 | 9/2008 | Serban et al. | |
| 2010/0088868 A1 | 4/2010 | Kando et al. | |
| 2011/0234052 A1 | 9/2011 | Amano et al. | |
| 2017/0222622 A1 | 8/2017 | Solal et al. | |
| 2018/0048282 A1 | 2/2018 | Kurimoto et al. | |
| 2019/0267967 A1 | 8/2019 | Kurimoto et al. | |

FOREIGN PATENT DOCUMENTS

| | | |
|---|---|---|
| JP | H07226638 A | 8/1995 |
| JP | H08316781 A | 11/1996 |
| JP | H09208399 A | 8/1997 |
| JP | H10178331 A | 6/1998 |
| JP | H11122073 A | 4/1999 |
| JP | 2001053579 A | 2/2001 |
| JP | 2002009567 A | 1/2002 |
| JP | 2005252550 A | 9/2005 |
| JP | 2006042008 A | 2/2006 |
| JP | 2006339308 A | 12/2006 |
| JP | 2007256709 A | 10/2007 |
| JP | 2008060382 A | 3/2008 |
| JP | 2010171955 A | 8/2010 |
| JP | 2011087079 A | 4/2011 |
| JP | 2013030829 A | 2/2013 |
| JP | 2013168864 A | 8/2013 |
| JP | 3187231 U | 11/2013 |
| JP | 2017046033 A | 3/2017 |
| JP | 2018026695 A | 2/2018 |
| WO | 2006120994 A1 | 11/2006 |
| WO | 2009081651 A1 | 7/2009 |
| WO | 2013031651 A1 | 3/2013 |
| WO | 2018097016 A1 | 5/2018 |

OTHER PUBLICATIONS

Hayashi, et al., ""High Coupling Leaky SAWs on LiTaO3 Thin Plate Bonded to Quartz Substrate", 2017 IEEE International Ultrasonics Symposium, IEEE, Sep. 6, 2017, 1-4)".

English translation of the Written Opinion of the International Searching Authority dated Dec. 26, 2019 issued in International Application No. PCT/JP2018/021898.

Notice of Allowance dated Aug. 3, 2022 issued in related U.S. Appl. No. 16/413,356.

International Preliminary Report on Patentability (IPRP) dated Aug. 18, 2020 issued in International Application No. PCT/JP2019/003861 (which is a counterpart of related U.S. Appl. No. 16/969,912).

Suzuki et al., "ST-quartz/LiTaO3 Direct Bonding Using SiO2 Amorphous Layers with VUV/O3 Pre-treatment for a Novel 5G Surface Acoustic Wave Device," 2016 International Conference on Electronics Packaging (ICEP), The Japan Institute of Electronics Packaging, Apr. 20, 2016.

International Search Report (ISR) dated Jul. 24, 2018 (and English translation thereof), issued in International Application No. PCT/JP2018/021898.

Takuya Kataoka, "Summary of Graduation Thesis Presentation", Yamanashi University, Faculty of Engineering, Department of Eleclii-cal and Electronic Engineering, Feb. 16, 2016.

Written Opinion of the International Searching Authority dated Jul. 24, 2018 issued in International Application No. PCT/JP2018/021898.

Isobe, et al., "Longitudinal Leaky SAW-Resonator in LiNbO3: the Combined Finite-Element and Analytical Method", Conference of the Institute of Electronics, Information, and Communications Engineers, A-195, 1996, p. 196.

Takuya Kataoka, "Highly coupling of longitudinal leaky surface acoustic wave by coupling LiTaO3 / LiNbO3 thin plate and quartz substrate", Yamanashi University, Graduate Thesis, Faculty of Engineering, Department of Elecliical and Electronic Engineering, Feb. 16, 2016.

Kobayashi, et al., "GHz-Band Surface Acoustic Wave Devices Using the Second Leaky Mode on LiTaO3 and LiBnO3", Jpn. J. Appl. Phys., vol. 36, Part 1, No. 9B, Sep. 1997, pp. 6083-6087.

Atsushi Isobe, et al., "Longitudinal Leaky SAW-Resonator in LiNbO3—the Combined Finite-Element and Analytical Method", Conference of Engineering Sciences Society in the Institute of Electronics, Information and Communication Engineers, A-195, 1996, 196.

Yasumi Kobayashi, et al., "GHz-Band Surface Acoustic Wave Devices Using the Second Leaky Mode on LiTaO3 and LiNbO3", Jpn. J. Appl. Phys. vol. 36 (Sep. 1997), Part 1, No. 9B, pp. 6083-6087.

Office Action (Non-Final Rejection) dated Apr. 11, 2023, issued in related U.S. Appl. No. 16/969,912.

* cited by examiner (a)phase velocity, (b)propagation attenuation,(c)TCF and $K^2$
in an LSAW of LN thin plate bonding structure (a) phase velocity, (b) propagation attenuation, (c) TCF and $K^2$ in an LSAW of LT thin plate bonding structure the particle displacement distribution u₂ (SH component) of
an LSAW of 36° YX-LT/AT 90°X-Quartz LSAW resonance characteristics (infinite periodic structure) on
36° YX-LT/AT 90° X-Quartz based on FEM analysis

BONDED SUBSTRATE, SURFACE ACOUSTIC WAVE ELEMENT, SURFACE ACOUSTIC WAVE ELEMENT DEVICE, AND BONDED SUBSTRATE MANUFACTURING METHOD

TECHNICAL FIELD

The present invention relates to a bonded substrate utilizing a surface acoustic wave, a surface acoustic wave element, a surface acoustic wave element device, and a method for manufacturing the bonded substrate.

BACKGROUND ART

With progress of mobile communication devices such as a mobile phone, high-performance surface acoustic wave (SAW) devices are also requested. In particular, for high-frequency trend and broadband trend, SAW substrates are requested to have a high-speed and high-coupling SAW mode, and excellent temperature characteristics preventing a pass-band from moving due to temperature change.

Furthermore, a leaky surface acoustic wave (Leaky SAW: also called LSAW and the like) and a longitudinal-type leaky surface acoustic wave (Longitudinal-type Leaky SAW: also called LLSAW and the like) have an excellent phase velocity, and is one of propagation modes advantageous to high-frequency trend of SAW devices. However, it disadvantageously has large attenuation propagation.

For example, Patent Literature 1 proposes a technique in which a proton exchange layer is formed in the vicinity of the surface of a lithium niobate substrate, and a reverse proton exchange layer is then formed only at the surface layer, whereby losses caused by bulk wave radiation of an LLSAW are intended to reduce.

Also in Non-Patent Literature 1 and Non-Patent Literature 2, optimizations of a substrate orientation and an electrode film thickness are attempted as techniques for low loss trend of LLSAWs.

As to temperature characteristics, a temperature coefficient of change in frequency is, for example, −35 ppm/° C. for lithium tantalate which is currently often used, and −79 ppm/° C. for lithium niobate, and variation in frequency is large. Therefore, the temperature coefficient of change in frequency is needed to be reduced.

Meanwhile, although the temperature coefficient of ST-cut quartz is 0 ppm/° C., which exhibits an excellent property, it is largely inferior in a propagation velocity and an electromechanical coupling factor to lithium tantalate and lithium niobate.

Patent Literature 2 discloses a device obtained by bonding a SAW propagating substrate and a supporting substrate by means of an organic thin film layer. The propagating substrate is a lithium tantalate substrate, for example, having a thickness of 30 μm, which is pasted on a glass substrate having a thickness of 300 μm by an organic adhesive agent having a thickness of 15 μm.

Patent Literature 3 also discloses a SAW device obtained by pasting a lithium tantalate substrate (thickness: 125 μm) on a quartz glass substrate (thickness: 125 μm) by an adhesive agent.

Patent Literature 4 reports that temperature characteristics are improved by thinning the organic adhesive layer in bonding between a lithium tantalate substrate and a supporting substrate.

However, while in Patent Literature 1, it is confirmed that losses caused by bulk wave radiation of an LLSAW are reduced and propagation characteristics and the like are remarkably increased, a problem is that the yield of devices having the proposed structure is extremely poor.

Neither Patent Literature 2 nor Patent Literature 3 discloses specific data that temperature characteristics are improved.

While in Patent Literature 4, the temperature characteristics are improved by thinning the organic adhesive layer, problems are, for example, that the temperature characteristics 15 ppm/° C. still does not reach 0 ppm/° C. of ST-cut quartz, and that the yield is poor and the like due to bonding using the adhesive agent.

The present inventors reveal that propagation attenuation is reduced in bonding a quartz substrate and a piezoelectric substrate to each other in Non-Patent Literatures 3 to 5.

For example, in Non-Patent Literature 3, in order to directly bond ST-cut quartz and $LiTaO_3$ (LT) to each other for a surface acoustic wave (SAW) device, an amorphous $SiO_2$ ($\alpha$-$SiO_2$) intermediate layer is used for bonding.

Non-Patent Literature 4 proposes an LLSAW obtained by bonding lithium tantalate in which X-cut at 31° and Y propagating, and lithium niobate in which X-cut at 36° and Y propagating to AT-cut quartz and increasing electromechanical coupling factor.

In Non-Patent Literature 5, a high coupling of longitudinal-type leaky surface acoustic wave is achieved by bonding a $LiTaO_3$ or $LiNbO_3$ thin plate and a quartz substrate to each other.

CITATION LIST

Patent Literature

[Patent Literature 1] Japanese Patent Laid-Open No. 2013-30829
[Patent Literature 2] Japanese Patent Laid-Open No. 2001-53579
[Patent Literature 3] Japanese Patent Laid-Open No. 2006-42008
[Patent Literature 4] Japanese Patent Laid-Open No. 2011-87079

Non-Patent Literature

[Non-Patent Literature 1] "GHz-band surface acoustic wave devices using the second leaky mode", Appl. Phis., vol. 36, no 9B, pp. 6083-6087, 1997
[Non-Patent Literature 2] "Characteristics of Longitudinal Leaky Surface Acoustic Wave Resonator in $LiNbO_3$: Analysis based on Finite Element Analytical Combined Method", Conference of Engineering Sciences Society in the Institute of Electronics, Information and Communication Engineers, A-195, p. 196, 1996
[Non-Patent Literature 3] "2016 International Conference on Electronics Packaging (ICEP)", Published by The Japan Institute of Electronics Packaging, Date of Issue: Apr. 20, 2016
[Non-Patent Literature 4] "Preprint of Graduation Thesis Event of Department of Electrical and Electronic Engineering, Technology Faculty, Yamanashi University in 2015", Published by Department of Electrical and Electronic Engineering, Technology Faculty, Yamanashi University, Date of Issue: Feb. 16, 2016
[Non-Patent Literature 5] "Graduation Thesis Event of Department of Electrical and Electronic Engineering, Technology Faculty, Yamanashi University in 2015", Event Date: Feb. 16, 2016

SUMMARY OF INVENTION

Technical Problem

The aforementioned Non-Patent Literatures 3 to 5 reveal that the electromechanical coupling factor is improved. However, the surface acoustic wave element is required to have an excellent temperature characteristic of frequency, and when a good temperature characteristic of frequency is not obtained, it is necessary to provide a temperature compensation element and the like to reduce temperature dependence. The LLSAW proposed in Non-Patent Literatures 3 to 5 has an improved electromechanical coupling factor, but the temperature characteristic of frequency is insufficiently improved.

In the LLSAW and the LSAW, the quartz substrate and the piezoelectric substrate are usually bonded to each other in a state where the orientations of the quartz substrate and the piezoelectric substrate are set in the same direction, to obtain mechanical bonding strength. It is considered that, if the direction is not the same direction but an intersecting direction, the thermal expansion coefficient of the quartz substrate is plus and the thermal expansion coefficient of the piezoelectric substrate is minus when a heat treatment performed after bonding is carried out, thereby thermal expansion difference is further increased, so that peeling or the like is apt to occur between two substrates.

The present inventors earnestly studied and, as a result, found that the orientations of the quartz substrate and the piezoelectric substrate are caused to intersect with each other in a suitable direction, so that the temperature characteristic of frequency is improved and good characteristics also obtained in the electromechanical coupling factor. Furthermore, the present inventors also found that a comparatively thin piezoelectric substrate is covalently bonded to a quartz substrate, at a bonding surface with the quartz substrate, whereby the piezoelectric substrate causes no problem such as peeling without having a problem with mechanical bonding strength.

The present invention is devised in view of the aforementioned circumstances, and an object thereof is to provide a bonded substrate, a surface acoustic wave element, and a surface acoustic wave element device which have both a high electromechanical coupling factor and an excellent temperature characteristic of frequency, and a method for manufacturing the bonded substrate.

Solution to Problem

A bonded substrate according to a first aspect of the present invention is characterized in that, including: a quartz substrate; and a piezoelectric substrate which is bonded on the quartz substrate and on which a surface acoustic wave propagates, wherein the quartz substrate and the piezoelectric substrate are bonded by covalently coupling at a bonding interface; and an orientation of the quartz substrate and an orientation of the piezoelectric substrate intersect with each other on an orthogonal direction side in a bonding surface direction.

A bonded substrate according to another aspect of the present invention is characterized in that, in the bonded substrate according to the first aspect, including: a quartz substrate; and a piezoelectric substrate which is bonded on the quartz substrate and on which a surface acoustic wave propagates, wherein the quartz substrate and the piezoelectric substrate are bonded by covalently coupling at a bonding interface; and an orientation of the quartz substrate and an orientation of the piezoelectric substrate intersect with each other in the range of 65 degrees to 115 degrees in a bonding surface direction.

A bonded substrate according to another aspect of the present invention is characterized in that, in the bonded substrate according to the above aspects, the piezoelectric substrate is used for exciting a leaky surface acoustic wave.

A bonded substrate according to another aspect of the present invention is characterized in that, in the bonded substrate according to the above aspects, including an amorphous layer between the quartz substrate and the piezoelectric substrate, wherein an interface between the amorphous layer and each of the quartz substrate and the piezoelectric substrate becomes the bonding interface.

A bonded substrate according to another aspect of the present invention is characterized in that, in the bonded substrate according to the above aspects, the amorphous layer has a thickness of 100 nm or less.

A bonded substrate according to another aspect of the present invention is characterized in that, in the bonded substrate according to the above aspects, the amorphous layer is composed of silicon dioxide or aluminum oxide.

A bonded substrate according to another aspect of the present invention is characterized in that, in the bonded substrate according to the above aspects, a thickness of the piezoelectric substrate corresponds to 0.05 to 1.0 wavelengths based on a wavelength of the surface acoustic wave.

A bonded substrate according to another aspect of the present invention is characterized in that, in the bonded substrate according to the above aspects, the quartz substrate has a thickness of 150 to 500 μm.

A bonded substrate according to another aspect of the present invention is characterized in that, in the bonded substrate according to the above aspects, the quartz substrate is an AT-cut quartz substrate or an ST-cut quartz substrate.

A bonded substrate according to another aspect of the present invention is characterized in that, in the bonded substrate according to the above aspects, the piezoelectric substrate is composed of lithium tantalate or lithium niobate.

A bonded substrate according to another aspect of the present invention is characterized in that, in the bonded substrate according to the above aspects, the piezoelectric substrate has a thickness of 0.1 to 100 μm.

A bonded substrate according to another aspect of the present invention is characterized in that, in the bonded substrate according to the above aspects, the bonded substrate has a temperature characteristic of frequency (TCF) of −20 to +5 ppm/° C. and a coupling factor ($K^2$) of 5% or more.

A surface acoustic wave element according to a first aspect of the present invention is characterized in that, a surface acoustic wave element comprising at least one interdigital electrode on a principal surface of the piezoelectric substrate in the bonded substrate according to the above aspects.

A surface acoustic wave element device according to a first aspect of the present invention is characterized in that, the surface acoustic wave element according to the above aspect is sealed in a package.

A method for manufacturing a bonded substrate according to a first aspect of the present invention is a method for manufacturing a bonded substrate in which a quartz substrate and a piezoelectric substrate are bonded to each other, the method is characterized in that, comprising:

irradiating a bonding surface of the quartz substrate and a bonding surface of the piezoelectric substrate with ultraviolet light under a reduced pressure;

the quartz substrate and the bonding surface are configured such that contacting the bonding surface of the quartz substrate and the bonding surface of the piezoelectric substrate with each other after the irradiation in a state where an orientation of the quartz substrate and an orientation of the piezoelectric substrate intersect with each other on an orthogonal direction side in a bonding surface direction; and pressurizing the quartz substrate and the piezoelectric substrate in a thickness direction to bond the bonding surfaces with each other.

A method for manufacturing a bonded substrate according to another aspect of the present invention is characterized in that, in the method for manufacturing a bonded substrate of the above aspect, heating at a predetermined temperature is performed in the pressurization.

A method for manufacturing a bonded substrate according to another aspect of the present invention is characterized in that, in the method for manufacturing a bonded substrate according to the above aspects, the quartz substrate is obtained by growing a crystal by a hydrothermal synthesis method and cutting out the crystal in any direction.

A method for manufacturing a bonded substrate according to another aspect of the present invention is characterized in that, in the method for manufacturing a bonded substrate according to the above aspects, an amorphous layer is interposed on one or both of the bonding surfaces of the quartz substrate and the piezoelectric substrate.

A method for manufacturing a bonded substrate according to another aspect of the present invention is characterized in that, in the method for manufacturing a bonded substrate according to the above aspects, the amorphous layer is attached by a thin film forming method.

Advantageous Effects of Invention

That is, the present invention has an effect of obtaining a surface acoustic wave element having an excellent temperature characteristic of frequency and a high electromechanical coupling factor.

DESCRIPTION OF EMBODIMENTS

Hereinafter, a bonded substrate and a surface acoustic wave element according to an embodiment of the present invention will be described with reference to the accompanying drawings.

A bonded substrate 5 includes a quartz substrate 2 and a piezoelectric substrate 3 bonded by covalently coupling via a bonding interface 4.

The quartz substrate 2 suitably has a thickness of 150 to 500 μm. The piezoelectric substrate 3 suitably has a thickness corresponding to 0.05 to 1.0 wavelengths based on the wavelengths of a surface acoustic wave. As the present invention, the thickness of the piezoelectric substrate more desirably is 0.05 to 0.8 wavelengths based on the wavelengths of the surface acoustic wave, and still more desirably is 0.05 to 0.25 wavelengths.

As the quartz substrate 2, it can use, for example, the quartz substrate which is obtained by growing a crystal by a hydrothermal synthesis method and cutting out the crystal in any direction. The piezoelectric substrate 3 can use a proper material, and be composed, for example, of lithium tantalate or lithium niobate. In particular, it can use lithium tantalate which is Y-cut at 36° in a plane orientation and X-propagating, or lithium niobate which is Y-cut at 41° and X-propagating.

Figure 1:
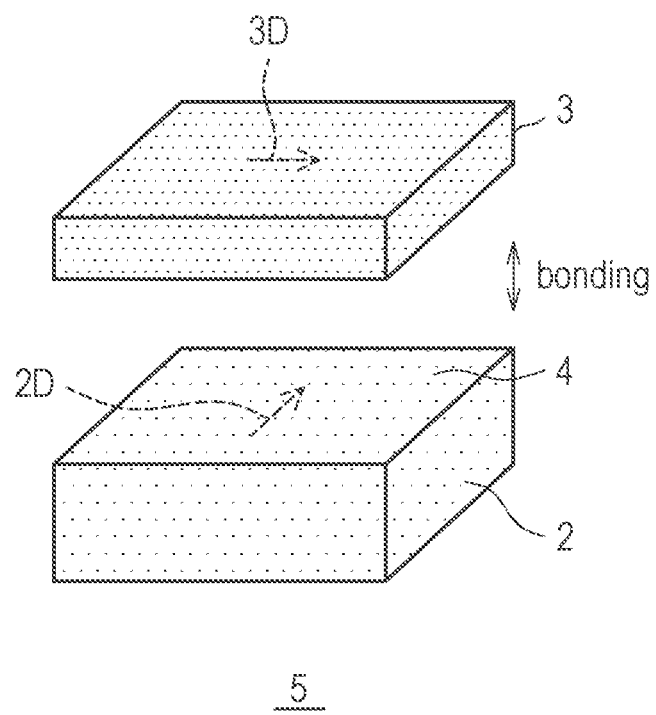
FIG. 1 is a schematic diagram illustrating a bonded state of a bonded substrate of an embodiment of present invention.

However, as shown in FIG. 1, in the bonding, the quartz substrate 2 and the piezoelectric substrate 3 are bonded to each other in a state where an orientation 2D of the quartz substrate and an orientation 3D of the piezoelectric substrate 3 intersect on a right angle direction side in a plane direction. The phrase "intersecting on a right angle direction side" means that an intersecting angle between the quartz substrate and the piezoelectric substrate exceeds 45 degrees. Suitably, the intersecting angle is desirably 65 degrees to 115 degrees. The bonded substrate in which the quartz substrate and the piezoelectric substrate are bonded to each other at the aforementioned intersecting angle has an excellent temperature characteristic of frequency and a high electromechanical coupling coefficient. When the intersecting angle is out of the aforementioned angle range, the results satisfied in both the temperature characteristic of frequency and the electromechanical coupling factor are not obtained. The bonded substrate having the aforementioned intersecting angle has TCF of −20 to +5 ppm/° C. and an electromechanical coupling factor $K^2$ of 5% or more.

Figure 2:
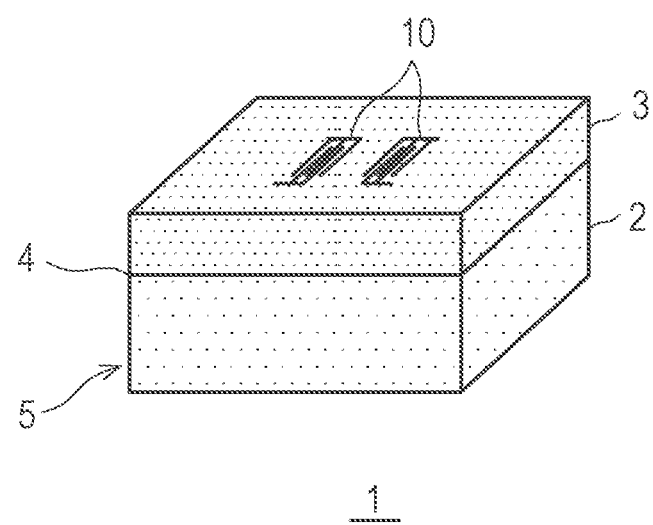
FIG. 2 is a schematic diagram illustrating the bonded substrate and a surface acoustic wave element in the same embodiment.

As shown in FIG. 2, a surface acoustic wave element 1 is obtained by providing an interdigital electrode 10 on the bonded substrate 5. In the present invention, an orientation represents a plane orientation. In this embodiment, the orientation represents an X direction of a surface Y-cut at 36° in LT, and an X direction of a surface Y-cut at 41° in LN, and the orientation represents an X direction of an AT-cut or ST-cut surface in the quartz substrate.

Figure 3:
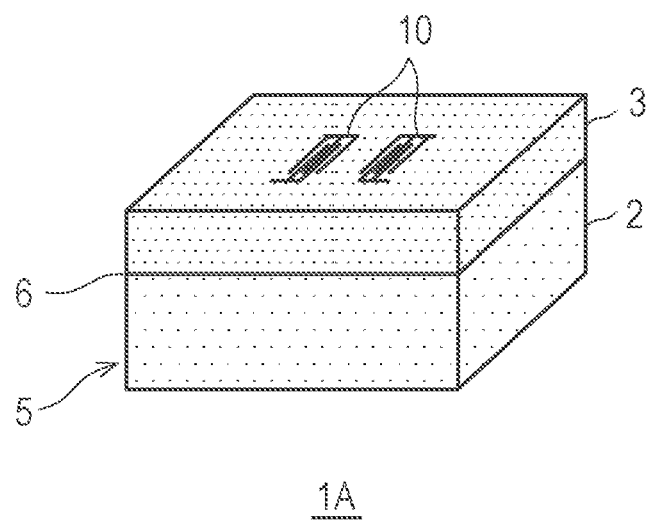
FIG. 3 is a schematic diagram illustrating a bonded substrate and a surface acoustic wave element in another embodiment.

As shown in FIG. 3, an amorphous layer 6 can be interposed between the quartz substrate 2 and the piezoelectric substrate 3 to provide a surface acoustic wave element 1A. The same configurations as those in the aforementioned embodiment are given the same reference numerals, and their description is omitted. Also in this embodiment, the quartz substrate 2 and the piezoelectric substrate 3 are bonded to each other in a state where an orientation of the quartz substrate 2 and an orientation of the piezoelectric substrate 3 intersect with each other on a right angle direction side in a plane direction.

In this embodiment, when the amorphous layer 6 is interposed therebetween, a bonding interface exists between the amorphous layer 6 and the quartz substrate 2, and on the other side of the amorphous layer 6, a bonding interface exists between the amorphous layer 6 and the piezoelectric substrate 3. The material of the amorphous layer 6 is not particularly limited in the present invention, but $SiO_2$ and $Al_2O_3$ and the like can be used. The thickness of the amorphous layer is desirably 100 nm or less.

In forming the amorphous layer 6, the amorphous layer 6 can be formed in a manner of forming a thin film on the surface of the quartz substrate 2 or the piezoelectric substrate 3. Amorphous layers can also be formed on both the surface of the quartz substrate 2 and the surface of the piezoelectric substrate 3.

The amorphous layer can be formed by a known method, and chemical vapor deposition or physical vapor deposition such as sputtering can be utilized.

Figure 4:
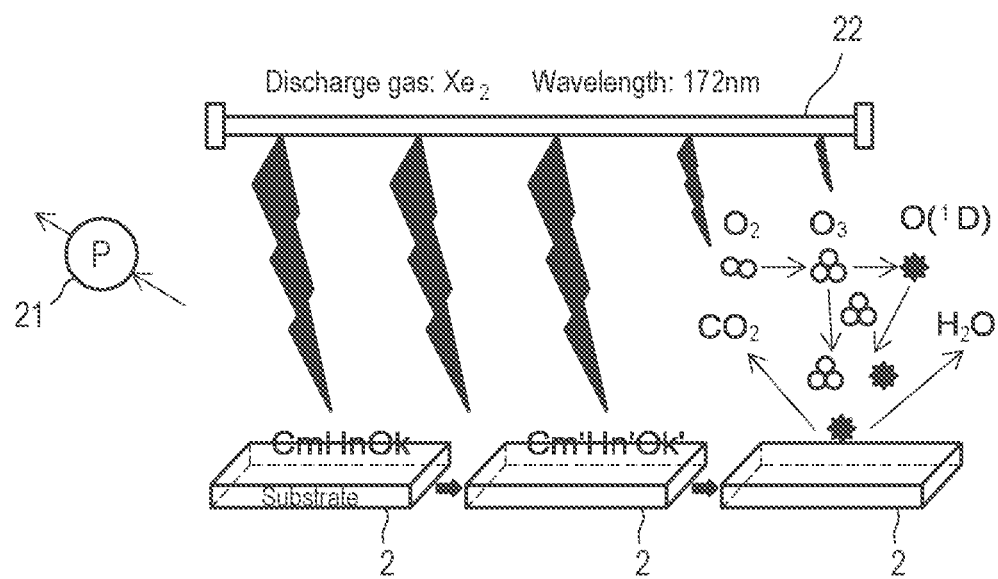
FIG. 4 is a schematic diagram illustrating a bonding processing apparatus used for manufacturing a bonded substrate in an embodiment of the present invention.

Next, manufacturing of the bonded substrate and the surface acoustic wave element will be described with reference to FIG. 4.

A quartz substrate and a piezoelectric element of predetermined materials are prepared. When an amorphous layer is formed on a bonding surface, with respect to one or both of the quartz substrate and the piezoelectric element which are the target to be formed, deposition processing is performed on the bonding surface side. A method for the deposition processing is not particularly limited, but a thin film forming technique such as a vacuum vapor deposition method or a sputtering method can be used. For example, an amorphous layer which has a thickness of 100 nm or less can be formed on the bonding surface by Electron Cyclotron Resonance plasma deposition. This amorphous film can be formed to have a very high film density, and hence, the degree of activation of the bonding surface is high, which results in generation of more OH groups.

The prepared quartz substrate 2 and piezoelectric substrate 3 are disposed in a processing apparatus 20 having a tightly-sealed structure. The figure presents only the quartz substrate 2.

A vacuum pump 21 is connected to the processing apparatus 20, and the processing apparatus 20 is depressurized to, for example a pressure of 10 Pa or less. Discharge gas is introduced into the processing apparatus 20, and discharge is performed by a discharge apparatus 22 in the processing apparatus 20 to generate ultraviolet light. The discharge can be performed by using a method for applying a high frequency voltage or the similar method.

The quartz substrate 2 and the piezoelectric substrate 3 are disposed in a state where they can be irradiated with ultraviolet light, and the bonding surfaces of the quartz substrate 2 and the piezoelectric substrate 3 are irradiated with ultraviolet light to be activated. When an amorphous layer is formed on one or both of the quartz substrate 2 and the piezoelectric substrate 3, the irradiation with ultraviolet light is performed by taking the surface of the amorphous layer as the bonding surface.

As for the quartz substrate 2 and the piezoelectric substrate 3 which have undergone the irradiation with ultraviolet light, in a state where the orientation of the quartz substrate 2 and the orientation of the piezoelectric substrate 3 intersect with each other on a right angle direction side in a plane direction, the bonding surfaces of the quartz substrate 2 and the piezoelectric substrate 3 are contacted with each other and heated at ambient temperature or a temperature of 200° C. or less, and a pressure is applied across both of them to perform bonding. The applied pressure can be set at 10 Pa and the processing time can be set to be approximately from 5 minutes to 4 hours. However, the pressure and the processing time are not particularly limited in the present invention.

By the aforementioned processing, the quartz substrate 2 and the piezoelectric substrate 3 are securely bonded by covalently coupling at the bonding interface, and are bonded in a state where the orientations of them intersect with each other on a right angle direction side.

Figure 5:
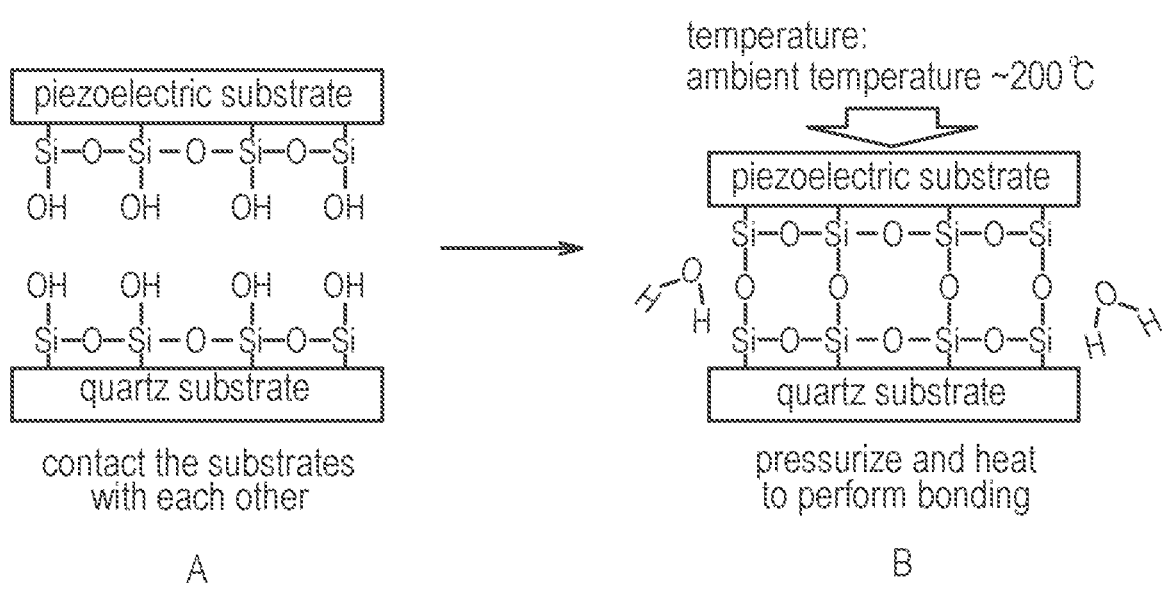
FIG. 5 is a diagram for explaining a bonding manner of the quartz substrate and the piezoelectric substrate in the same embodiment.

FIG. 5 shows states of the bonding surfaces of the quartz substrate 2 and the piezoelectric substrate 3.

Portion A of the FIG. 5 shows a state where the bonding surfaces are activated by irradiation with ultraviolet light and OH groups are formed on the surfaces. Portion B of the FIG. 5 shows a state where the substrates are contacted with each other, and pressurized and heated to perform bonding. In the bonding, the OH groups react so that the substrates are covalently coupled with each other. Extra $H_2O$ is release to the outside in heating.

The aforementioned processes provide the bonded substrate. With respect to the bonded substrate, as shown in FIG. 1, patterns of interdigital electrodes 10 are formed on the principal surface of the piezoelectric substrate 3. A method for forming the interdigital electrodes 10 is not particularly limited, but a proper method can be used. For the shape of the interdigital electrode 10, a proper shape can be employed. The aforementioned processes provide the surface acoustic wave element 1. The propagation direction of the acoustic wave is along the orientation of the piezoelectric substrate 3.

Figure 6:
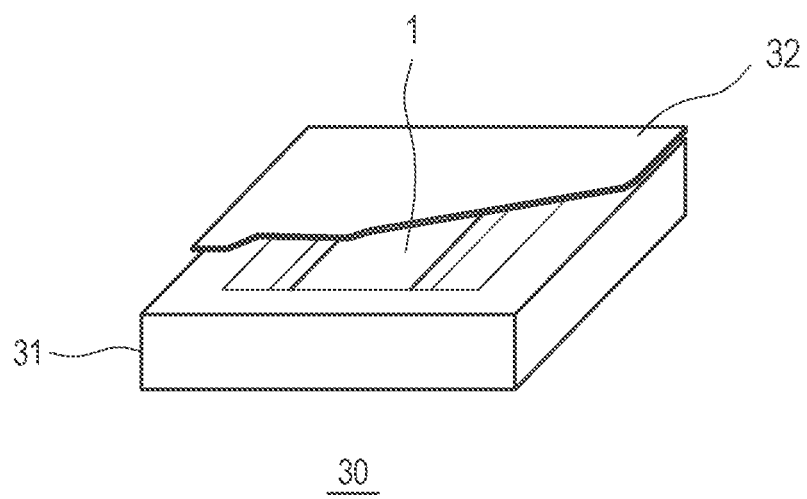
FIG. 6 is a schematic diagram illustrating a surface acoustic wave device in the same embodiment.

As shown in FIG. 6, the surface acoustic wave element 1 is disposed in a packaging 31 and connected to not-shown electrodes and sealed with a lid 32, thereby can be provided as a surface acoustic wave device 30.

Example 1

Hereinafter, Example of the present invention are described. A bonded substrate was obtained based on the aforementioned embodiment. A SAW resonator was provided on the principal surface of a piezoelectric substrate such that the propagation direction of an LLSAW becomes the X-direction.

In this example, as the piezoelectric substrate, lithium tantalate which was Y-cut at 36° in a plane orientation and X-propagating, and lithium niobate which was Y-cut at 41° in a plane orientation and X-propagating were used. As a quartz substrate in which crystal was grown by a hydrothermal synthesis method, a quartz substrate having a thickness of 250 μm and cut out in an AT-cut direction or a ST-cut direction was used.

The bonded sample was polished on the lithium tantalate side to be thin.

For the obtained bonded substrate, its bonding strength was measured by a method of tensile testing (tension is applied perpendicular to the wafer plane). As a result, it was found that 5 MPa or more (converted into the value per unit area) of bonding strength was obtained, furthermore, excellent bonding strength which leads to the bulk destruction was obtained.

As for the sample material obtained by making the piezoelectric substrate thin after bonding the quartz substrate and the piezoelectric substrate to each other, a phase velocity, an electromechanical coupling factor, and a temperature characteristic of frequency of the LSAW were calculated. Quartz constant of Kushibiki et al. (p. 83), lithium niobate (hereinafter, referred to as LN) constant of Kushibiki et al., and lithium tantalate (hereinafter, referred to as LT) constant (p. 377) described in "Acoustic Wave Device Technique" edited by the Japan Society for the Promotion of Science, the 150th committee of acoustic wave element technique, were used for calculating.

The LSAW having propagation attenuation was analyzed based on the method of Yamanouchi et al., and the analysis of a layer structure was performed by using the methods of Farnell and Adler. In these analyses, the phase velocity and the propagation attenuation of the LSAW which propagates on the layer structure are analyzed by numerically solving the acoustic wave motion equation and the charge conservation equation under a boundary condition.

A phase velocity vf of the free surface (Free), and a phase velocity $v_m$ when the surface of the thin plate was electrically shorted (metallized) were obtained, and $K^2$ was obtained from $K^2=2\times(v_f-v_n)/v_f$. A linear expansion coefficient in a propagation direction was assumed to the linear expansion coefficient of a quartz supporting substrate, and a temperature coefficient of frequency (TCF) of the electrically shorted surface was calculated.

It is considered that, since the quartz has large anisotropy, propagation characteristics during bonding largely depend on the propagation direction of the quartz. As a result of calculating the phase velocity of the LSAW with respect to a propagation angle from an X-axis on AT-cut quartz, it was found that this phase velocity was the highest speed in X-propagating at 0° and X-propagating at 90° in the LSAW. In these propagation orientations, the maximum phase velocity difference from the LN/LT simplex provides an expectable concentration effect of particle displacement.

Figure 7:
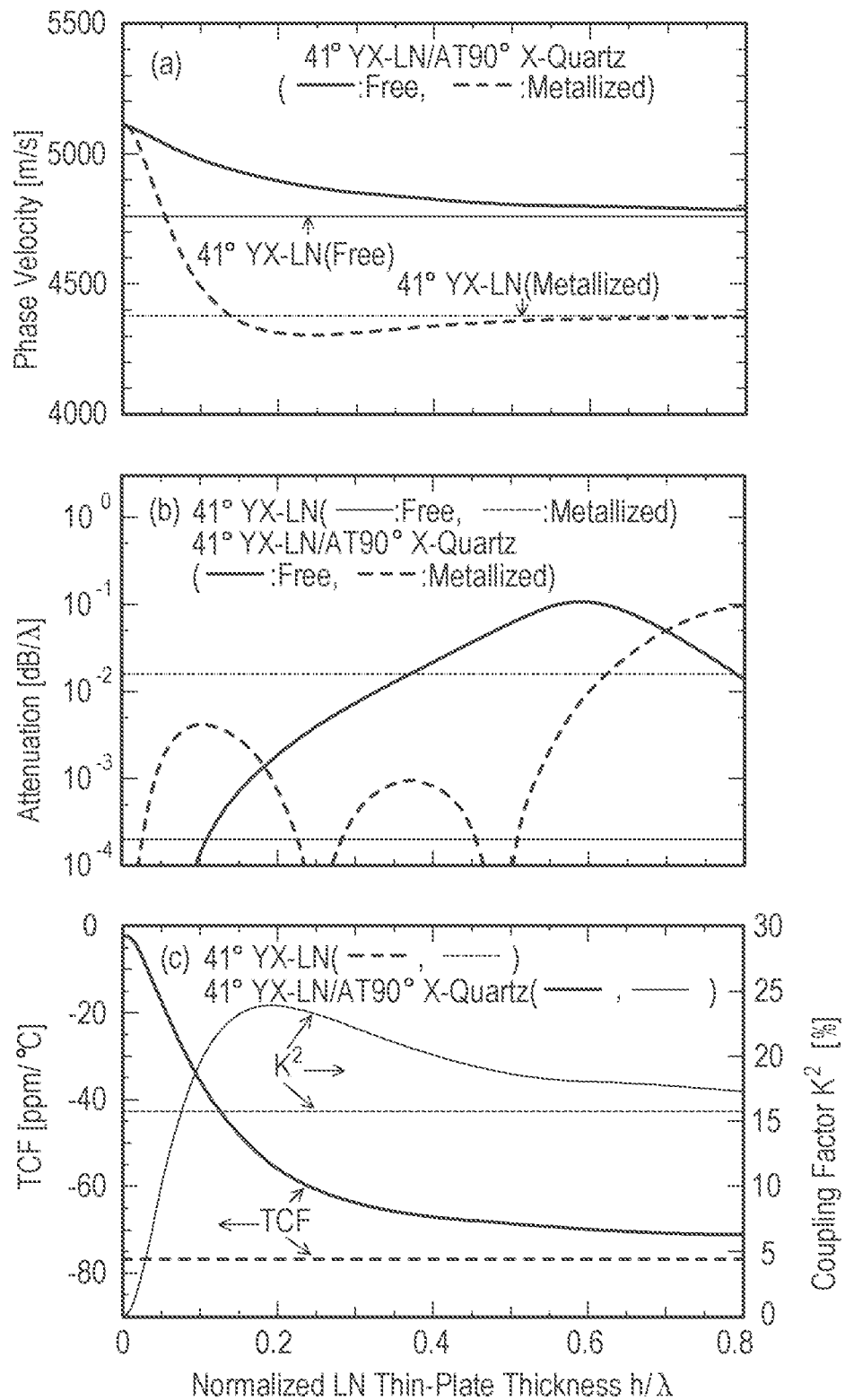
FIG. 7 is a graph illustrating the relationship between the thickness of a piezoelectric substrate and each of a phase velocity, propagation attenuation, TCF, and $K^2$ in an LSAW of LN/AT90° X-Quartz in the same embodiment.
Figure 8:
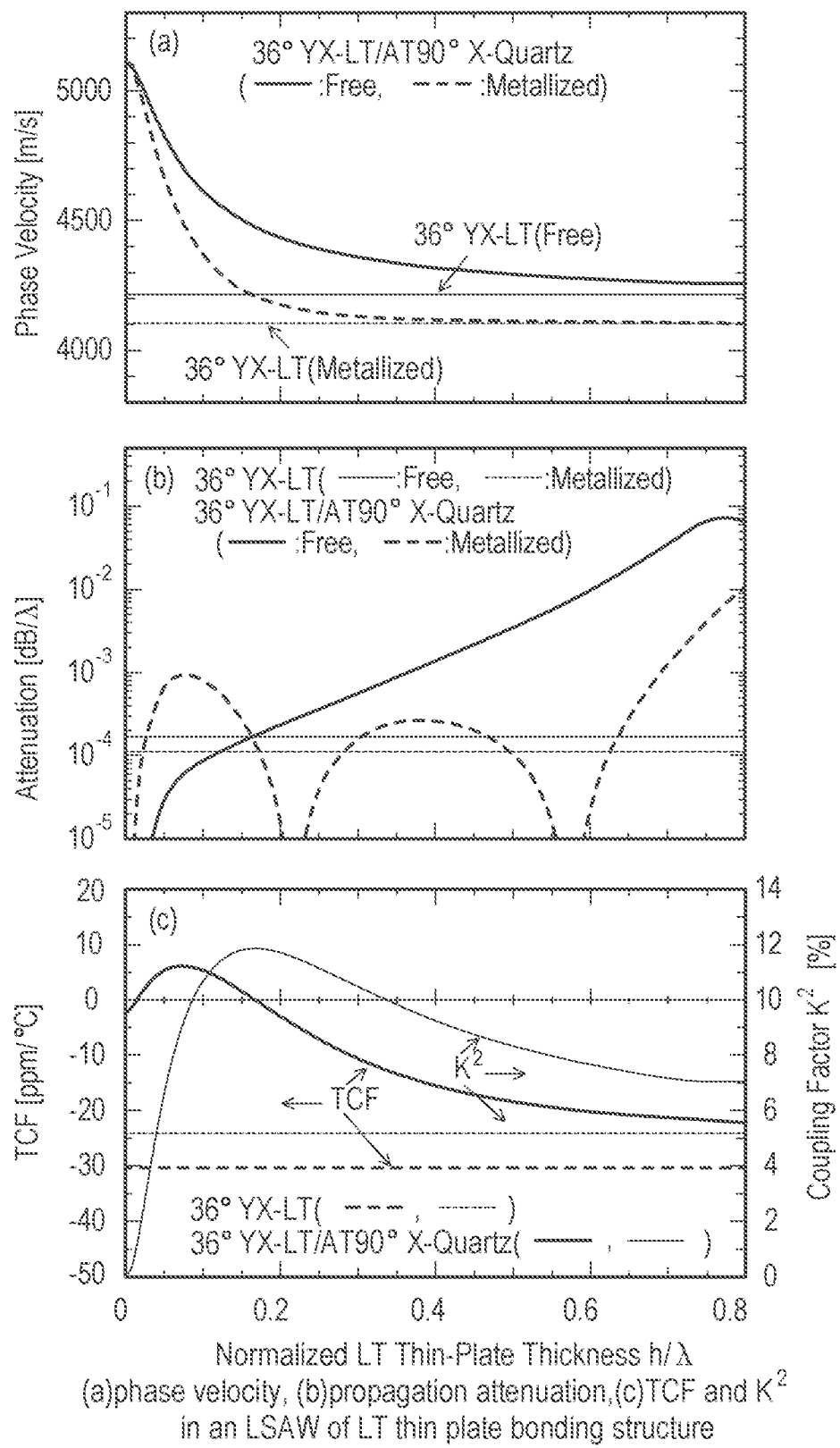
FIG. 8 is a graph illustrating the relationship between the thickness of a piezoelectric substrate and each of a phase velocity, propagation attenuation, TCF, and $K^2$ in an LSAW of LT/AT90° X-Quartz in the same embodiment.

FIG. 7 and FIG. 8 show the calculated values of (a) phase velocity, (b) propagation attenuation, and (c) TCF and $K^2$ of the LSAW when the 41° YX-LN thin plate and the 36° YX-LT thin plate obtained by the aforementioned analysis were bonded to AT-cut 90° X-quartz (intersecting angle of 90 degrees, hereinafter, the same shall apply), respectively. A horizontal axis represents a plate thickness h/λ of LN and LT thin plates normalized by a wavelength λ. In both of the cases, it is found that the increase in the plate thickness causes the phase velocity of quartz simplex to approach asymptotically to the phase velocity of the LN/LT simplex. When attention is paid to the $K^2$ calculated value, a plate thickness in which $K^2$ greater than the value of the simplex is obtained exists in both the cases. In the present invention, as the suitable range of the plate thickness, the plate thickness has a thickness corresponding to 0.05 to 1.0 wavelengths based on the wavelength of the surface acoustic wave. In this range, an excellent value than that of the TCF of the LT/LN simplex is shown. $K^2$ is higher than that of the simplex LN when h/λ is 0.08 or more, and higher than that of the simplex LT when h/λ is 0.4 or more. Taking these into consideration, the plate thickness h/λ is more desirably set to 0.05 to 0.8.

The 41° YX-LN thin plate exhibited $K^2$ which was 1.5 times (23.9%) of that of the simplex when the plate thickness h/λ was 0.19, and the propagation attenuation of the plate thickness and the TCF of the electrically shorted surface were respectively calculated to be 0.002 dB/λ or less and −55 ppm/° C. Meanwhile, the 36° YX-LT thin plate simultaneously exhibited TCF of 0 and $K^2$ of 11.9% (2.3 times of the simplex) when the plate thickness h/λ was 0.17. It was found that the propagation attenuation of the plate thickness was 0.0002 dB/λ or less, and a substrate structure having high stability, high coupling, and low loss is obtained.

Figure 9:
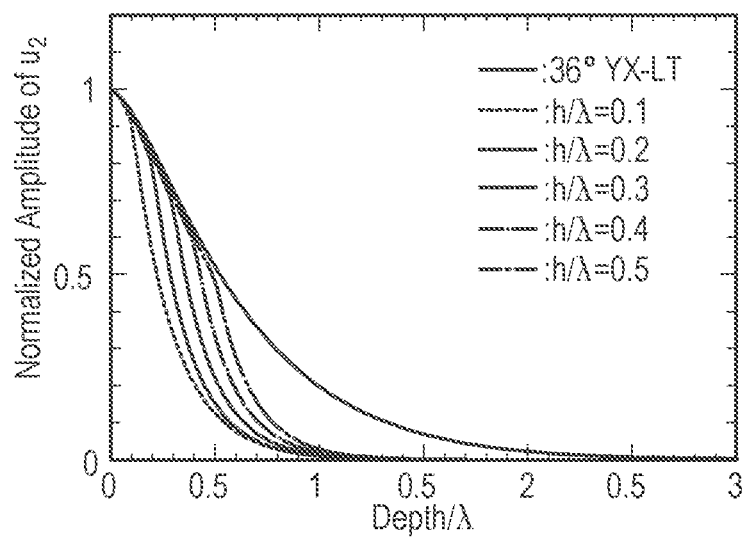
FIG. 9 is a graph illustrating the particle displacement distribution of an LSAW of 36° YX-LT/AT90° X-Quartz in the same embodiment.

In order to examine the factor of the high coupling as described above, a particle displacement distribution with respect to the depth direction of the LSAW was calculated. The aforementioned analysis was used in the calculation. As for the LSAW on 36° YX-LT/AT90° X-quartz, the displacement distribution of SH ingredient ($u_2$) in the electrically shorted surface is shown in FIG. 9. The displacement is normalized by a surface value. It was found that the displacement distribution of the bonding structure concentrated near the surface as compared with that of the LT simplex, and a thinner normalized plate thickness provided a higher concentration effect.

Next, the resonance characteristics of the LSAW of an IDT type resonator (λ=8.0 μm, intersection width W=25λ) formed on an LT/quartz bonding structure were analyzed by using the Finite Element Method (FEM). Femtet (manufactured by Murata Software Co., Ltd.) was used as analysis software. As an analysis model, the plate thickness of the supporting substrate was set to 10λ. A periodic boundary condition (infinite periodic structure) was assumed on both sides of the IDT for one cycle, and a completely-matched layer was assumed on the bottom face.

Figure 10:
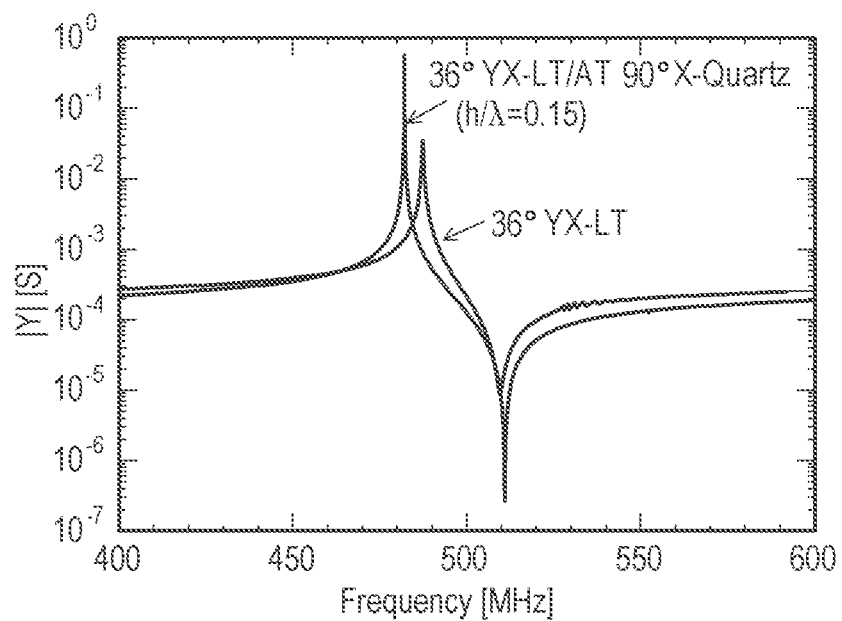
FIG. 10 is a graph illustrating LSAW resonance characteristics (infinite periodic structure) on 36° YX-LT/AT90° X-Quartz based on FEM analysis in the same embodiment.

FIG. 10 shows the analysis example of the LSAW on the 36° YX-LT/AT90° X-Quartz structure. An LT plate thickness is 0.15λ, and an electrode Al film thickness is 0.09λ. In the bonding structure, an admittance ratio of 126 dB was obtained, which was markedly increased as compared with 72 dB of the LT simplex. Resonance Q was increased by an order of magnitude to 12050 from 1350 of the LT simplex. A specific bandwidth was also increased to 5.7% from 4.4% of the LT simplex.

Figure 11:
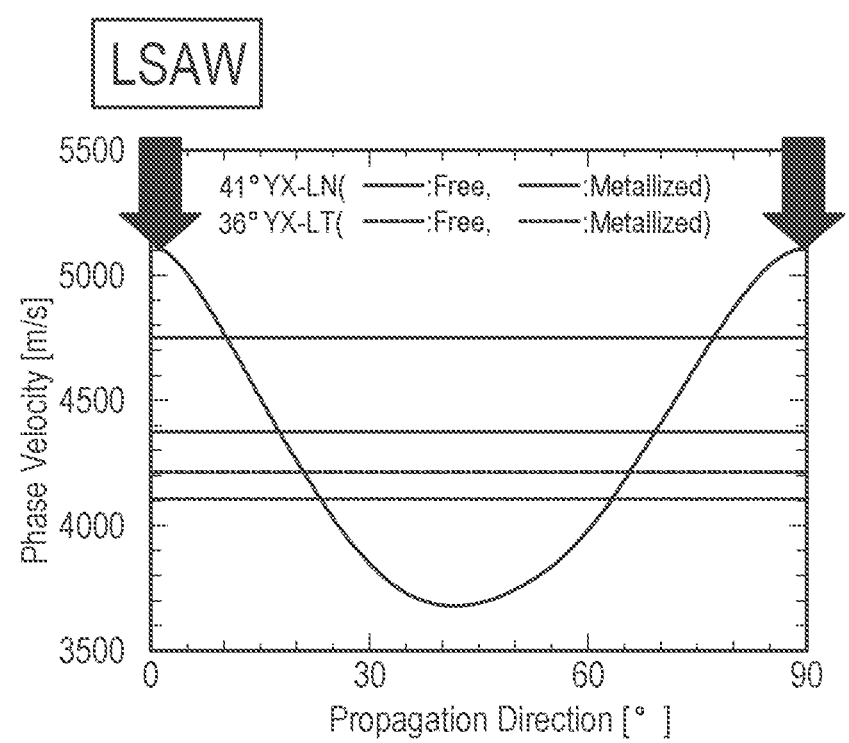
FIG. 11 is a diagram illustrating the relationship between an intersecting angle and a phase velocity in the same embodiment.

Next, the change in the phase velocity due to the misalignment of the orientations of the 41° YX-LN or 36° YX-LT and the AT-cut quartz substrate was obtained by the analysis described in Paragraph 0047, and shown in FIG. 11.

As is apparent from FIG. 11, the phase velocity reaches a maximum when the intersecting angle between the AT-cut quartz substrate and the LN or the LT is 0 degree and 90 degree, and the phase velocity is smaller as the intersecting angle is away from 0 degrees and 90 degrees.

Figure 12:
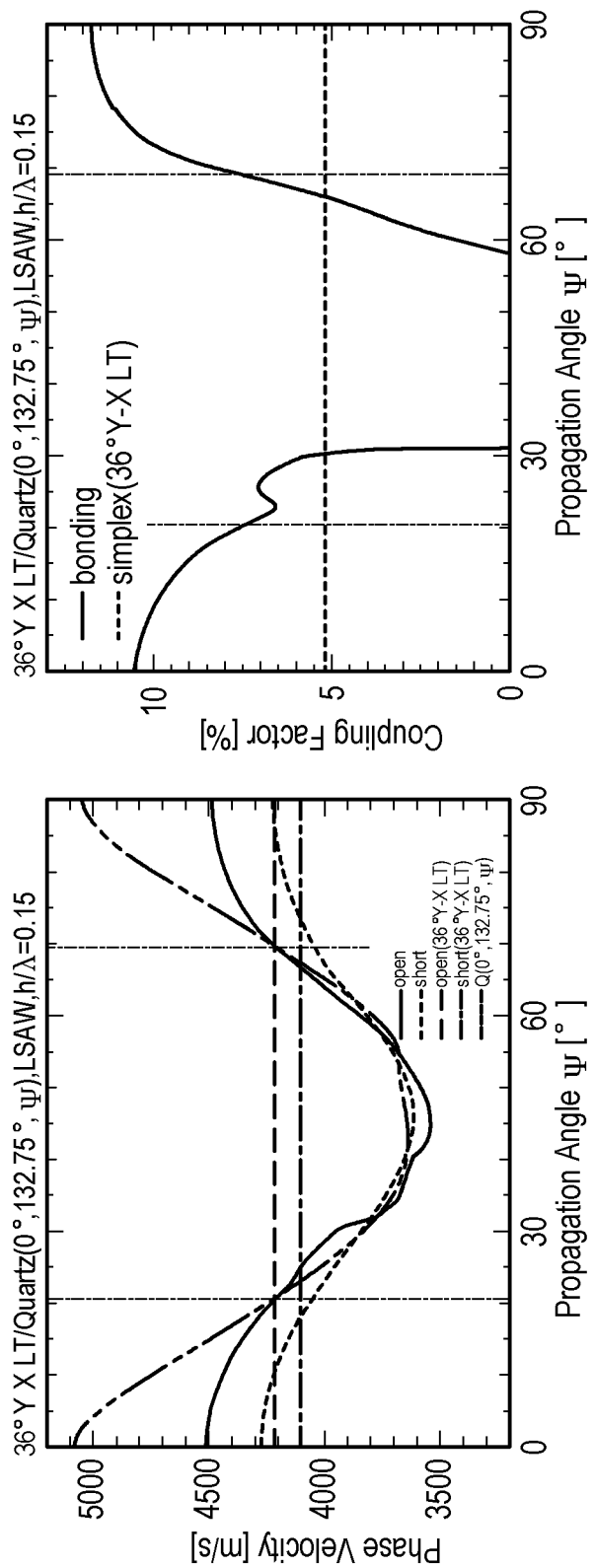
FIG. 12 is a diagram illustrating the relationship between an intersecting angle and a phase velocity, and the relationship between an intersecting angle and an electromechanical coupling factor in the same embodiment.

Next, changes in a phase velocity and an electromechanical coupling factor when an orientation angle difference in bonding was changed in the bonded substrate of the 36° YX-LT having h/λ of 0.15 and the ST-cut quartz substrate were calculated by the aforementioned analysis, and shown in FIG. 12. It is found that, when the intersecting angle of the orientations is 0 degrees or 90 degrees, changes in a phase velocity and an electromechanical coupling factor show the maximum numerical value, but the intersecting angle is desirably 30 degrees or less or 65 degrees to 115 degrees in order to obtain an electromechanical coupling factor $K^2$ of 5% or more. The electromechanical coupling factor of 5% is $K^2$ obtained in the LT simplex, and the combination of the piezoelectric substrate with the quartz has an advantage that the electromechanical coupling factor is 5% or more.

Figure 13:
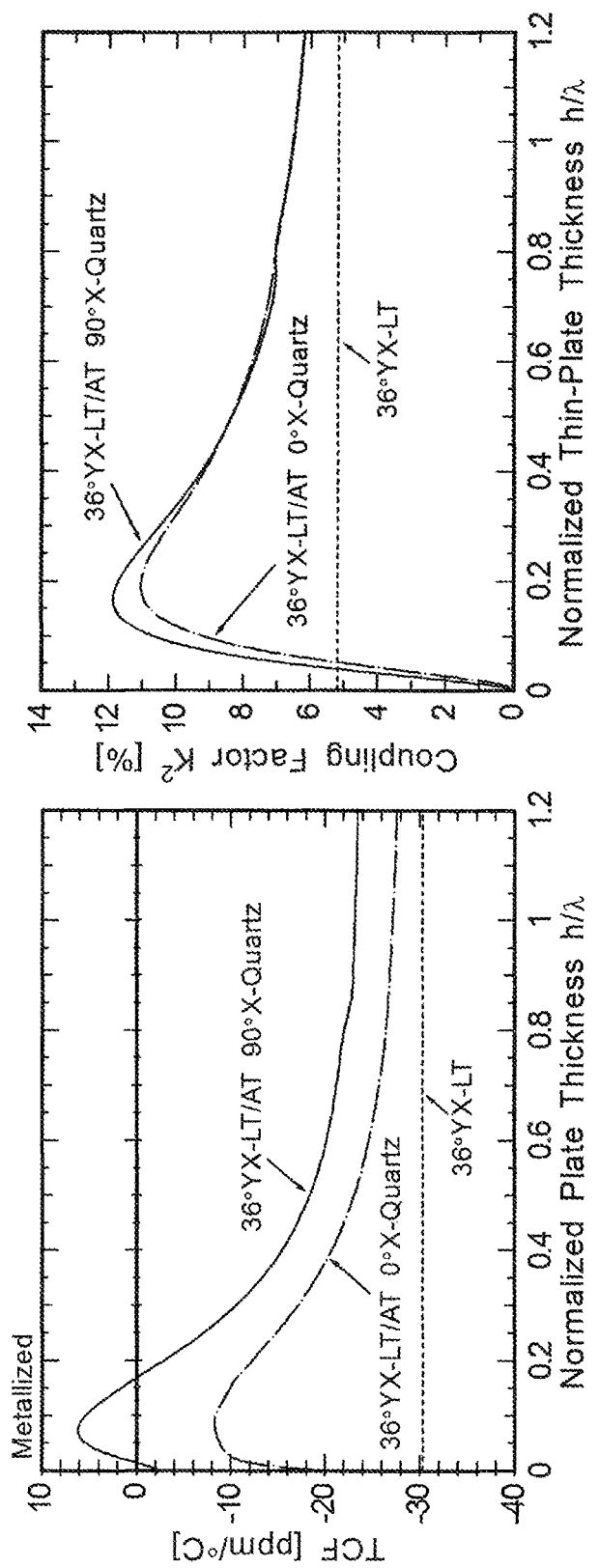
FIG. 13 is a graph illustrating the relationship between an intersecting angle and TCF, and the relationship between an intersecting angle and an electromechanical coupling factor in the same embodiment.

Next, as for the bonded substrate obtained by bonding the 36° YX-LT and the AT-cut quartz substrate to each other at an intersecting angle of 0 degrees and the bonded substrate obtained by coupling the 36° YX-LT and the AT-cut quartz substrate at an intersecting angle of 90 degrees, TCF and an electromechanical coupling factor were calculated by the aforementioned analysis, and the results were shown in FIG. 13.

As is apparent from the right drawing of FIG. 13, both of the bonded substrates having intersecting angles of 0 degrees and 90 degrees have a high electromechanical coupling factor in a suitable thickness. As for the thickness h/λ of the piezoelectric substrate, examples of the range in which TCF exceeds 0° include 0.05 to 0.25.

Meanwhile, as for the TCF, by appropriately setting the thickness of the bonded substrate having an intersecting angle of 90 degrees, the result that the TCF becomes 0 ppm/° C. is obtained. However, even when the TCF is the smallest, the bonded substrate having an intersecting angle of 0 degrees has a temperature characteristic of frequency of about −10 ppm/° C., which is clearly poorer than the bonded substrate having an intersecting angle of 90 degrees in the aspect of temperature characteristic of frequency. Therefore, in order to obtain excellent characteristics in both the TCF and the electromechanical coupling factor, the quartz substrate and the piezoelectric substrate are required to intersect with each other on an orthogonal direction side in a bonding surface direction.

Figure 14:
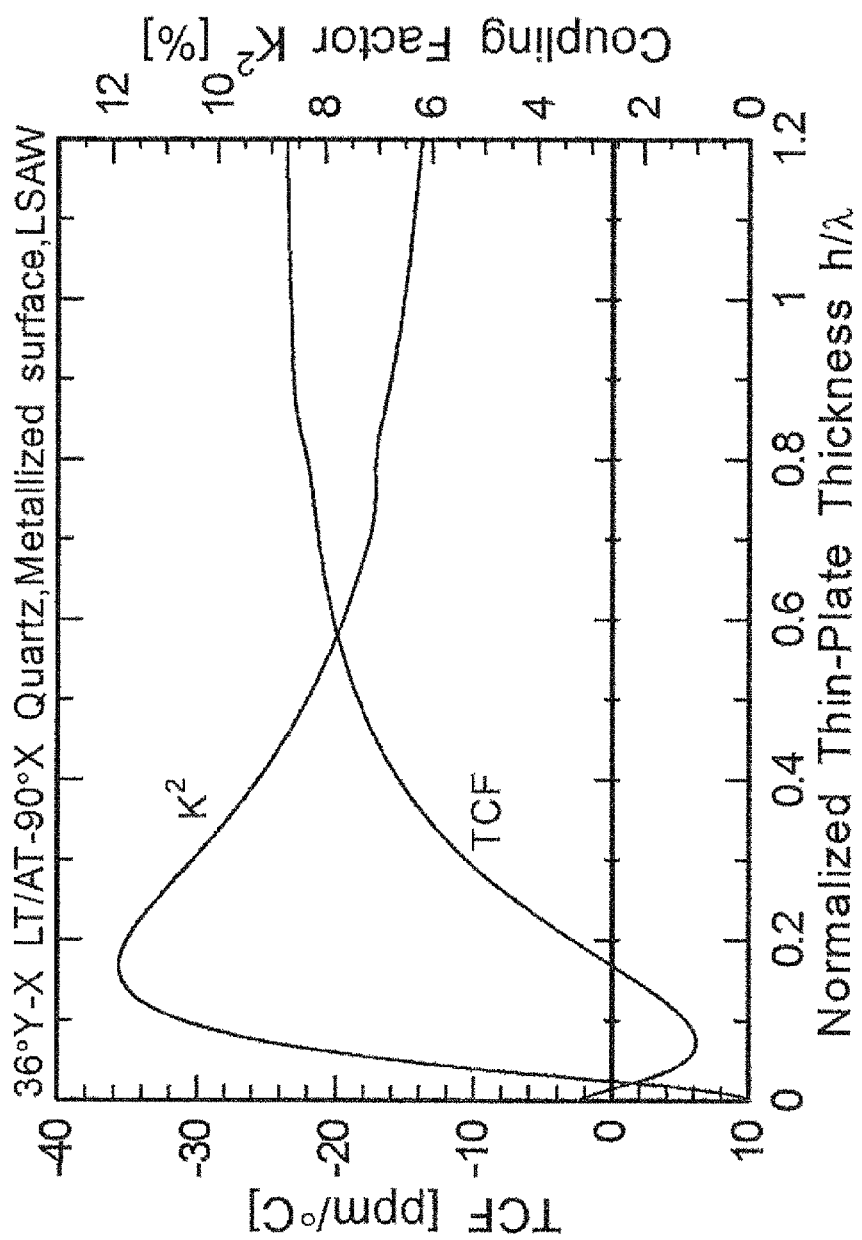
FIG. 14 is a diagram illustrating the relationship between the thickness of a piezoelectric substrate and each of TCF and an electromechanical coupling factor in the same embodiment.

In the bonded substrate having an intersecting angle of 90 degrees, the TCF and the electromechanical coupling factor were collectively shown in FIG. 14. As is apparent from this figure, in order to obtain a better TCF and a higher electromechanical coupling factor, it is found that h/λ of the piezoelectric substrate is desirably set properly. In the case of this figure, h/λ is set to the range of 0.05 to 1.0, whereby more desirable results are obtained in both the temperature characteristic of frequency and the coupling characteristic.

As above, the present invention has been described based on the aforementioned embodiment and Example. The scope of the present invention is not limited to the contents of the aforementioned description, but proper modifications of the aforementioned embodiment and Example can occur without departing from the scope of the present invention.

INDUSTRIAL APPLICABILITY

The present invention can be utilized for a SAW resonator, a SAW filter, a highly-functional piezoelectric sensor, and a BAW device and the like.

REFERENCE SIGNS LIST

1: surface acoustic wave element
1A: surface acoustic wave element
2: quartz substrate
2D: quartz substrate orientation
3: piezoelectric substrate
3D: piezoelectric substrate orientation
4: bonding interface
5: bonded substrate
10: interdigital electrode
20: processing apparatus
30: surface acoustic wave device

The invention claimed is:

1. A bonded substrate comprising:
a quartz substrate; and
a piezoelectric substrate which is bonded on the quartz substrate and on which a surface acoustic wave propagates,
wherein
the quartz substrate and the piezoelectric substrate are bonded by covalently coupling at a bonding interface; and
a crystal orientation of the quartz substrate and a crystal orientation of the piezoelectric substrate intersect with each other on an orthogonal direction side in a bonding surface direction.

2. The bonded substrate according to claim 1, wherein the piezoelectric substrate is used for exciting a leaky surface acoustic wave.

3. The bonded substrate according to claim 1, comprising an amorphous layer between the quartz substrate and the piezoelectric substrate, wherein an interface between the amorphous layer and each of the quartz substrate and the piezoelectric substrate becomes the bonding interface.

4. The bonded substrate according to claim 3, wherein the amorphous layer has a thickness of 100 nm or less.

5. The bonded substrate according to claim 3, wherein the amorphous layer is composed of silicon dioxide or aluminum oxide.

6. The bonded substrate according to claim 1, wherein a thickness of the piezoelectric substrate corresponds to 0.05 to 1.0 wavelengths based on a wavelength of the surface acoustic wave.

7. The bonded substrate according to claim 1, wherein the quartz substrate has a thickness of 150 to 500 μm.

8. The bonded substrate according to claim 1, wherein the quartz substrate is an AT-cut quartz substrate or an ST-cut quartz substrate.

9. The bonded substrate according to claim 1, wherein the piezoelectric substrate is composed of lithium tantalate or lithium niobate.

10. The bonded substrate according to claim 9, wherein the piezoelectric substrate has a thickness of 0.1 to 100 μm.

11. The bonded substrate according to claim 1, wherein the bonded substrate has a temperature characteristic of frequency (TCF) of −20 to +5 ppm/° C. and a coupling factor ($K^2$) of 5% or more.

12. A surface acoustic wave element comprising at least one interdigital electrode on a principal surface of the piezoelectric substrate in the bonded substrate according to claim 1.

13. A surface acoustic wave element device, wherein the surface acoustic wave element according to claim 12 is sealed in a package.

14. A method for manufacturing the bonded substrate of claim 1, the bonded substrate including the quartz substrate and the piezoelectric substrate that are bonded to each other, the method comprising:
irradiating a bonding surface of the quartz substrate and a bonding surface of the piezoelectric substrate with ultraviolet light under a reduced pressure;
arranging the quartz substrate and the piezoelectric substrate such that the bonding surface of the quartz substrate and the bonding surface of the piezoelectric substrate contact with each other after the irradiation in a state where the crystal orientation of the quartz substrate and the crystal orientation of the piezoelectric substrate intersect with each other on the orthogonal direction side in the bonding surface direction; and pressurizing the quartz substrate and the piezoelectric substrate in a thickness direction with the quartz substrate and the piezoelectric substrate arranged in said state to bond the bonding surfaces with each other.

15. The method for manufacturing a bonded substrate according to claim 14, wherein heating at a predetermined temperature is performed in the pressurization.

16. The method for manufacturing a bonded substrate according to claim 14, wherein the quartz substrate is obtained by growing a crystal by a hydrothermal synthesis method and cutting out the crystal in any direction.

17. The method for manufacturing a bonded substrate according to claim 14, wherein an amorphous layer is interposed on one or both of the bonding surfaces of the quartz substrate and the piezoelectric substrate.

18. The method for manufacturing a bonded substrate according to claim 17, wherein the amorphous layer is attached by a thin film forming method.

19. A bonded substrate comprising:

a quartz substrate; and a piezoelectric substrate which is bonded on the quartz substrate and on which a surface acoustic wave propagates, wherein the quartz substrate and the piezoelectric substrate are bonded by covalently coupling at a bonding interface; and a crystal orientation of the quartz substrate and crystal orientation of the piezoelectric substrate intersect with each other in the range of 65 degrees to 115 degrees in a bonding surface direction.

* * * * *